United States Patent
Ballandras et al.

(10) Patent No.: US 10,879,874 B2
(45) Date of Patent: Dec. 29, 2020

(54) ONE-PORT SURFACE ELASTIC WAVE RESONATOR ON HIGH PERMITTIVITY SUBSTRATE

(71) Applicant: SENSEOR, Valbonne-Sophia-Antipolis (FR)

(72) Inventors: Sylvain Ballandras, Besançon (FR); Sébastien Alzuaga, Tarcenay (FR)

(73) Assignee: SENSEOR, Sophia-Antipolis (FR)

( * ) Notice: Subject to any disclaimer, the term of this patent is extended or adjusted under 35 U.S.C. 154(b) by 0 days.

(21) Appl. No.: 15/222,506

(22) Filed: Jul. 28, 2016

(65) Prior Publication Data
US 2017/0033840 A1    Feb. 2, 2017

(30) Foreign Application Priority Data

Jul. 31, 2015    (FR) ...................................... 15 57372

(51) Int. Cl.
*H04B 5/00*    (2006.01)
*G01K 11/26*    (2006.01)
(Continued)

(52) U.S. Cl.
CPC ............ *H03H 9/25* (2013.01); *B60C 23/0449* (2013.01); *G01K 11/265* (2013.01);
(Continued)

(58) Field of Classification Search
CPC .............. B60C 23/0449; G01K 11/265; G06K 19/0675; H03H 9/02275; H03H 9/02535;
(Continued)

(56) References Cited

U.S. PATENT DOCUMENTS

| 5,877,661 A | * | 3/1999 | Ohmura | ............... | H03H 9/0028 333/193 |
| 2004/0007945 A1 | * | 1/2004 | Gouk | .................... | B06B 1/0207 310/317 |

(Continued)

FOREIGN PATENT DOCUMENTS

| EP | 0 481 733 A1 | 4/1992 |
| EP | 2 287 584 A1 | 2/2011 |

(Continued)

OTHER PUBLICATIONS

MEMSnet Material: Zinc Oxide (ZnO), film charecteristics Oct. 16, 2012 https://web.archive.org/web/20121016114553/http://www.memsnet.org/material/zincoxideznofilm/.*

(Continued)

*Primary Examiner* — Omer S Khan
(74) *Attorney, Agent, or Firm* — BakerHostetler (57) ABSTRACT

A surface elastic wave resonator comprises a piezoelectric material to propagate the surface elastic waves and a transducer inserted between a pair of reflectors comprising combs of interdigitated electrodes and having a number Nc of electrodes connected to a hot spot and an acoustic aperture W wherein the relative permittivity of the piezoelectric material is greater than about 15, a product of Nc·W/fa for the transducer being greater than 100 $\mu m \cdot MHz^{-1}$, where fa is the antiresonance frequency of the resonator. A circuit comprises a load impedance and a resonator according to the invention and having an electrical response manifesting as a peak in the coefficient of reflection $S_{11}$ at a frequency of a minimum value of the parameter $S_{11}$ that is lower than −10 dB, the antiresonance peak of the resonator being matched to the impedance of the load.

19 Claims, 8 Drawing Sheets

(51) Int. Cl.
   *H03H 9/145* (2006.01)
   *H03H 9/17* (2006.01)
   *H03H 9/19* (2006.01)
   *H03H 9/25* (2006.01)
   *B60C 23/04* (2006.01)
   *H03H 9/02* (2006.01)
   *G06K 19/067* (2006.01)

(52) U.S. Cl.
   CPC ....... *G06K 19/0675* (2013.01); *H03H 9/0259* (2013.01); *H03H 9/02275* (2013.01); *H03H 9/02535* (2013.01); *H03H 9/14502* (2013.01); *H03H 9/175* (2013.01); *H03H 9/19* (2013.01); *H04B 5/0056* (2013.01)

(58) Field of Classification Search
   CPC .. H03H 9/0259; H03H 9/14502; H03H 9/175; H03H 9/19; H03H 9/25; H04B 5/0056
   See application file for complete search history.

(56) References Cited

U.S. PATENT DOCUMENTS

| | | | | |
|---|---|---|---|---|
| 2004/0196119 A1* | 10/2004 | Shibahara | ............ | H03H 9/0038 333/193 |
| 2007/0145830 A1* | 6/2007 | Lee | ......................... | H02J 50/70 307/135 |
| 2008/0258983 A1* | 10/2008 | Bauer | .................. | H03H 9/6409 343/722 |
| 2009/0230816 A1* | 9/2009 | Kidoh | ................ | H03H 9/02551 310/313 A |
| 2012/0206996 A1* | 8/2012 | Ballandras | .......... | G06K 19/0672 367/2 |
| 2012/0223616 A1* | 9/2012 | Bates | ....................... | H03H 3/10 310/313 A |
| 2012/0286900 A1* | 11/2012 | Kadota | .............. | H03H 9/02559 333/188 |

FOREIGN PATENT DOCUMENTS

| | | | | |
|---|---|---|---|---|
| FR | 2 864 618 A1 | 7/2005 | | |
| FR | 2 951 335 A1 | 4/2011 | | |
| FR | 2951335 A1 * | 4/2011 | ............. | H03H 9/542 |

OTHER PUBLICATIONS

D. Morgan, "Surface Acoustic Wave Filters: With Applications to Electronic Communications and Signal Processing," Academic Press, Second Edition, 2007.

* cited by examiner

ONE-PORT SURFACE ELASTIC WAVE RESONATOR ON HIGH PERMITTIVITY SUBSTRATE

CROSS-REFERENCE TO RELATED APPLICATIONS

This application claims priority to foreign French patent application No. FR 1557372, filed on Jul. 31, 2015, the disclosure of which is incorporated by reference in its entirety.

FIELD OF THE INVENTION

The field of the invention is that of one-port elastic wave resonators that may, in particular, be used in measurement systems comprising elastic wave resonant devices that are remotely interrogable via a radiofrequency wireless link. These devices may be used, in particular, in the context of remotely interrogable passive sensors.

BACKGROUND

Such sensors are known for being used, for example, as pressure or temperature sensors and generally comprise at least one resonator comprising a microstructure deposited on the surface of a piezoelectric substrate. An exemplary sensor may typically comprise at least one transducer with interdigitated combs of electrodes that are placed between reflective gratings, forming a resonator. The reflective gratings behave as Bragg mirrors and there are therefore resonant frequencies for which the return path in the cavity is equal to a whole number of acoustic wavelengths λ. The resonant modes for these frequencies are excited by the transducer placed between the mirrors.

This type of sensor may be remotely interrogated, by connecting the input of the transducer to a radiofrequency (RF) antenna. When the antenna receives an electromagnetic signal, the latter gives rise to waves on the surface of the substrate which are themselves converted back to electromagnetic energy in the antenna. Thus, the device formed from at least one resonator connected to an antenna has a response at the resonant frequency of the resonator that is measurable remotely. Remotely interrogable sensors may thus be produced. Additionally, the power transmitted to the resonator is determined by the spectral overlap between the transmitted pulse and the transfer function of the transducer.

The field of the present invention more specifically relates to the applications of sensors that are able to operate at high temperatures, typically potentially being between 300 and 1000° C.

Research has been carried out in the context of a large-scale research program called "SAWHOT", corresponding to the acronym for "Surface acoustic wave wireless sensors for high-operating temperature environments", and pertaining to the design of remotely interrogable wireless temperature sensors that are capable of operating at temperatures ranging from −200° C. to +650° C., and based on substrates of langasite (LGS) type, which material is known for its good temperature withstand properties (melting point at about 1470° C., lack of a Curie temperature, retention of piezoelectric properties up to at least 900° C.).

In this context, the Applicant considered, in particular, resonators produced on two cuts of LGS, the inversion temperature of one (the cut referred to as (YX)) being about 300° C. while the other (cut (YX/t)/48.5°/26.7°, referred to as the standard cut) behaves in an almost linear manner in terms of temperature-frequency drift over the entire measurement range (300-800° C.).

The use of these two cuts for the development of differential temperature sensors with separate and coupled resonators was the subject of European patent application CNRS/ENSMM/TU-Clausthal EP 143062107.

Figure 1A:
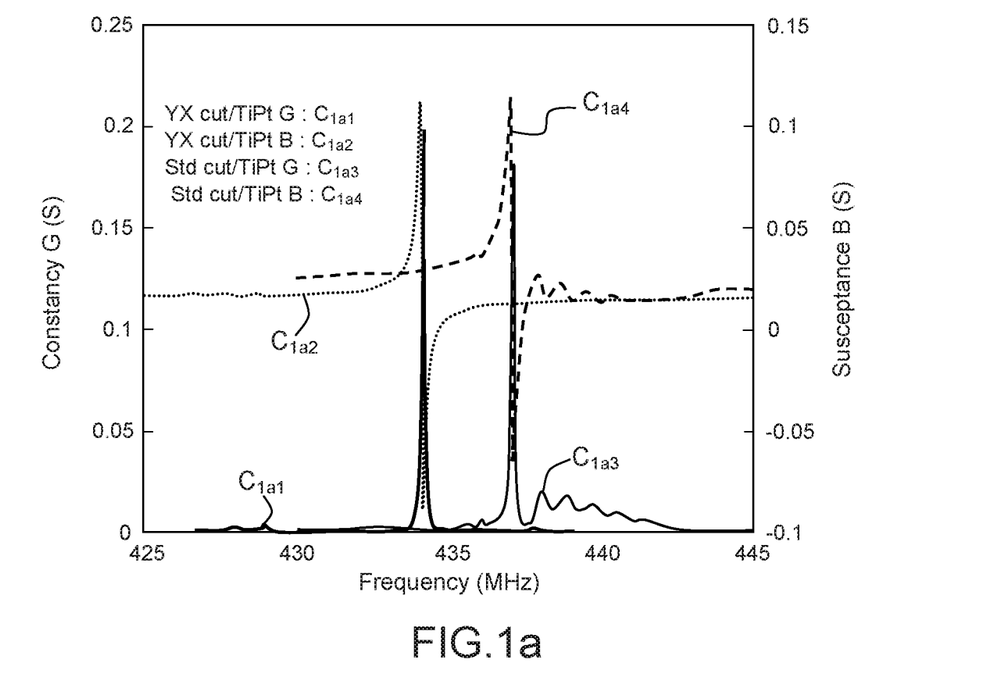
FIGS. 1a and 1b illustrate, respectively, the responses in terms of admittance as a function of frequency and the responses in terms of $S_{11}$ parameters as a function of frequency for devices developed in the context of the SAWHOT program.

The work carried out in the context of this project demonstrated, in particular, that it was possible to balance the response of the resonators in terms of conductance and susceptance and hence to obtain admittances that are balanced in terms of coupling and quality coefficient, as shown in FIG. 1a (curves $C_{1a1}$ and $C_{1a3}$ relate to the conductances and $C_{1a2}$ and $C_{1a4}$ relate to the susceptances). More specifically, it appears that it is possible to obtain an optimization that gives rise to responses in terms of admittance of the same amplitude (200 mS at peak conductance), having comparable coupling coefficients (between 0.2 and 0.3%) and similar quality coefficients (of the order of 2500 to 3000), the coupling coefficient of a resonator being proportional to the relative difference between the resonance and antiresonance frequencies, the quality coefficient being relative to the ratio $f_0/\Delta f$, $f_0$ being the center frequency and $\Delta f$ being the full width at half maximum of the conductance (real part of the admittance) or of the resistance (real part of the impedance), depending on whether the resonator is characterized in terms of its resonance or its antiresonance.

Figure 1B:
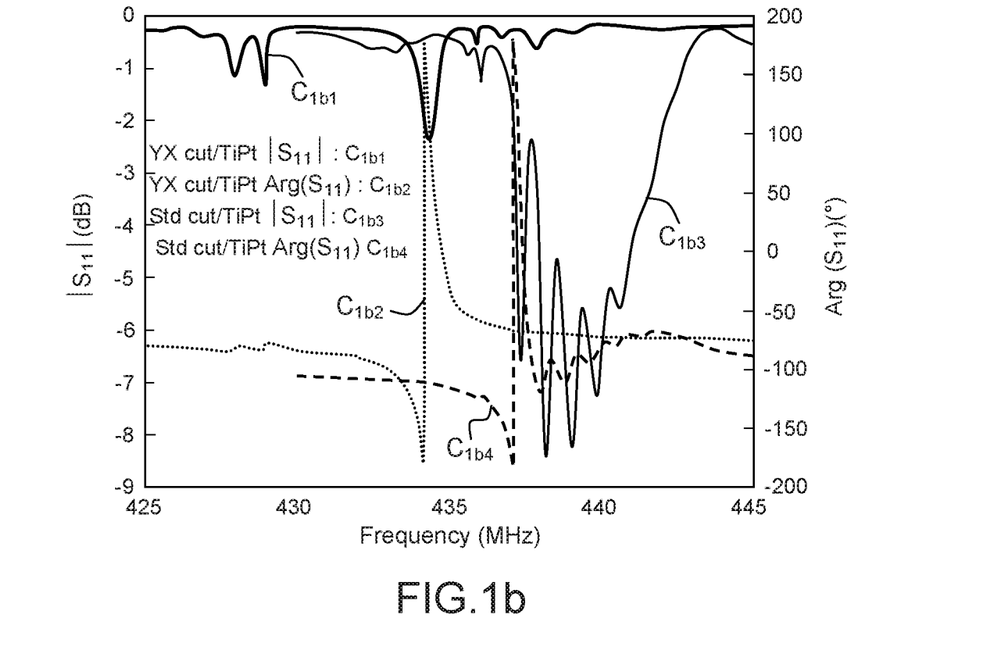

However, if the responses are observed in terms of corresponding $S_{11}$ parameters (representing the coefficient of reflection that reflects the absorption of energy within the resonator, by analyzing what is returned) as illustrated in FIG. 1b (curves $C_{1b1}$ and $C_{1b3}$ relate to the parameter $|S_{11}|$, curves $C_{1b2}$ and $C_{1b4}$ relate to the parameter $Arg(S_{11})$), it may be seen that, on the one hand, the amplitude of the reflection peak is mediocre and that, on the other hand, the spectrum is far from having the desired spectral purity. The modulus of the parameter $S_{11}$ exhibits, in particular, a negative peak (when represented logarithmically) that becomes more marked as the impedance of the resonator at the corresponding frequency approaches 50Ω. It is therefore necessary to extend the design rules in order to obtain satisfactory performance in terms of coefficient of reflection $S_{11}$.

Against this background, the Applicant turned to a new approach to the design of resonators in the context of the problem of one-port resonators based on material with relatively high (typically higher than 15) dielectric permittivity, such as langasite.

SUMMARY OF THE INVENTION

In order to do this, the Applicant has developed new design criteria mainly relating to the coefficient of reflection $S_{11}$ of the resonators, taking the predominance of this parameter in the phase of interrogating the sensors into account.

Figure 2:
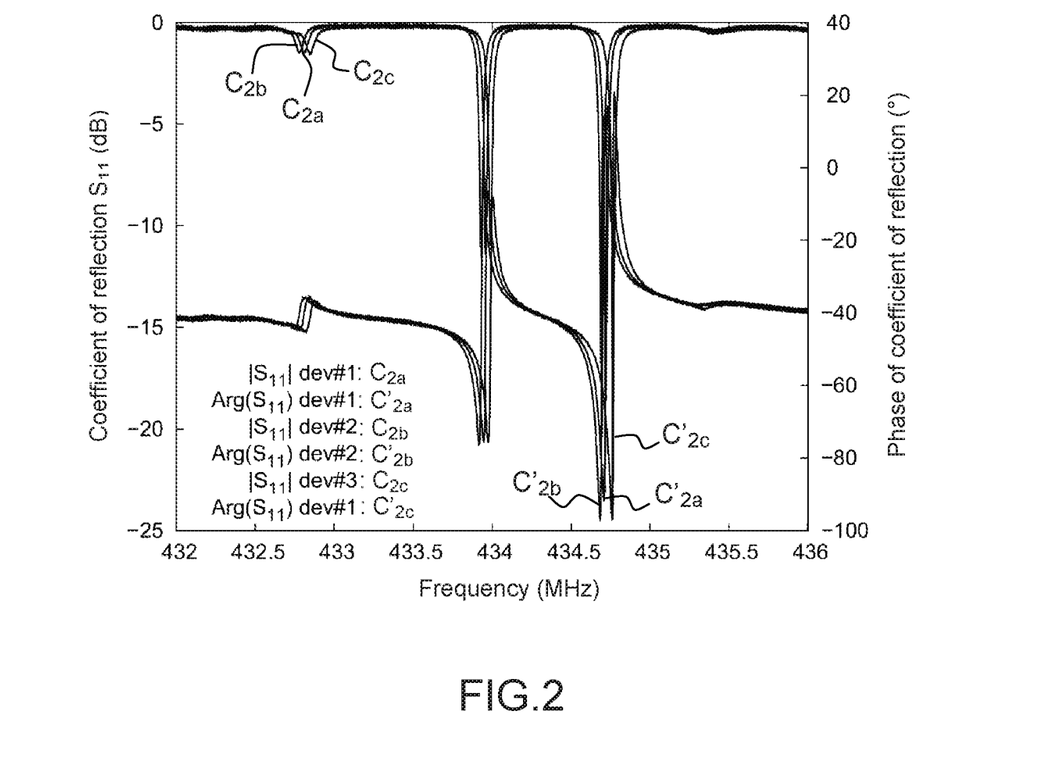
FIG. 2 illustrates the response, in terms of $S_{11}$ coefficient, of the SEAS10 sensor, showing peaks with a dynamic range of more than 15 dB but a phase rotation of only 80° to 120°.

The retained criteria are:

a minimum value of the parameter $S_{11}$ must be at least −10 dB, a typical value of −15 dB being recommended. By way of example, the dynamic range of the response in terms of reflection of a SEAS10 sensor by SENSeOR is higher, in terms of absolute value, than this typical value;

satisfactory spectral purity, namely a single peak coinciding with the excitation/detection of the surface mode. Parasitic peaks are inevitably seen, these having to be pushed to a minimum of 5 dB with respect to the main peak, it typically being sought to achieve a shift of these modes by 10 dB in order to guarantee the operation of the sensor over its temperature range. The phase exhibits a typical rotation of 180° (namely of π and never less than 120° or 2π/3) in order to guarantee the operation of the sensor as a resonator. In support of this point, FIG. 2 shows the response, in terms of $S_{11}$ coefficient, of the SEAS10 sensor, containing peaks with a dynamic range of more than 15 dB but a phase rotation of only 80° to 120°. The phase rotation reflects the capacity of the resonator to behave as a capacitor before the resonance and as an inductor between the resonance and the antiresonance. A phase rotation of less than 80 to 120° indicates that the behavior of the resonator is limited by the preponderance of the static capacitor at the expense of the motional parameters (the curves $C_{2a}$, $C_{2b}$ and $C_{2c}$ relate to S11 coefficients, the curves $C'_{2a}$, $C'_{2b}$ and $C'_{2c}$ relate to the phases). For a high-quality resonator, the behaviour of the equivalent circuit at resonance or at antiresonance is mainly determined by the motional resistor (specifically, the modulus of the admittance or of the impedance is almost identical to its real part). If losses (of resistive, radiative, viscoelastic, etc. types) are too high, the imaginary part of the admittance of or the impedance at resonance or at antiresonance plays a non-negligible role and the resonator is not able to fully express the change in capacitive-inductive behavior. The capacitive part then tends to prevail and to curb the effect of resonance.

In the context of the design of efficient resonators on LGS and taking the particularly wide working temperature range into account, obtaining a spectrally pure response over the entire range in terms of $S_{11}$ parameters presents a real difficulty.

From the analysis of the designs from the "SAWHOT" program, the Applicant concluded that the impedance of the corresponding devices does not allow a single-mode spectral response to be obtained. Specifically, with impedance values of several hundreds of ohms and despite efforts to reduce parasitic peaks to their minimum, the reflection peaks corresponding to a partial impedance match at 50Ω proved to be particularly numerous.

Generally, obtaining a pure spectral response in the sense of the reflection parameter $S_{11}$ means bringing either the resonance peak or the antiresonance peak as close as possible to an impedance comparable to the load impedance seen from the resonator or the resonator pair, for example if the latter are connected in parallel to one and the same antenna. This load impedance is often equal to 50Ω, but it may take any value between 50 and 100Ω, or even more for specially designed antennas. The load impedance of an open space dipole antenna will typically be 75Ω.

Any intermediate situation in the sense of the impedance exhibited by the resonator or the pair of resonators gives rise to the types of responses obtained in the context of the "SAWHOT" program.

The present considerations are true in the context of use of langasite and take its acousto-electric and dielectric properties into account, but they are also applicable to all similar materials (LGT, LGN, etc.) and, more generally, to all materials typically used for the remote interrogation of resonators.

In order to illustrate this approach, the Applicant considered that each resonator was independently connected to a load circuit with a characteristic impedance equal to 50Ω; this illustration is in no way restrictive, the principle potentially being applied to the case of a load of 75, 100, 150Ω and, generally, to any impedant load specific to a radiofrequency (RF) antenna or to any host circuit of the resonator.

The Applicant thus considered the following alternative: either it is possible to force the resonance peak into the vicinity of 50Ω, the antiresonance located at multiple kΩ thus making no significant contribution to the parameter $S_{11}$, or it is possible to tune the antiresonance peak to close to 50Ω.

The studies carried out by the Applicant demonstrated that surface elastic wave resonators produced on piezoelectric substrates having relatively high dielectric permittivities, typically greater than 15, are able to provide very good performance in terms of $S_{11}$ coefficient and spectral purity with designs that are optimized in terms of electrode architecture if the antiresonance peak is tuned to close to the load impedance, potentially typically 50Ω or more.

For this reason, another, more specific, subject of the present invention is thus a surface elastic wave resonator comprising a piezoelectric material intended to propagate the surface elastic waves and at least one transducer inserted between a pair of reflectors, said transducer comprising combs of interdigitated electrodes, having a number Nc of electrodes that are connected to a hot spot and an acoustic aperture W, characterized in that the relative permittivity of the piezoelectric material is greater than about 15, a product of Nc·W/fa for said transducer being greater than 100 μm·MHz$^{-1}$, where fa is the antiresonance frequency of said resonator.

In a known manner, the acoustic aperture of a transducer corresponds to the length of overlap between two fingers of combs of different polarity.

In a known manner, the relative permittivity $\varepsilon_r$ is defined by:

$$\varepsilon = \varepsilon_0 \times \varepsilon_r$$

where ε is the permittivity and $\varepsilon_0$ is the permittivity of a reference medium (vacuum) and is equal to 8.854187×10$^{-12}$ F·m$^{-1}$.

According to variants of the invention, the piezoelectric material is langasite, the product of Nc·W/fa possibly being between 100 and 1000 μm·MHz$^{-1}$.

According to variants of the invention, the piezoelectric material is zinc oxide, the product of Nc·W/fa possibly being between 400 and 2000 μm·MHz$^{-1}$.

According to variants of the invention, the piezoelectric material is quartz, the product of Nc·W/fa possibly being between 2400 and 3600 μm·MHz$^{-1}$.

According to variants of the invention, the piezoelectric material is aluminum nitride AlN, the product of Nc·W/fa possibly being between 400 and 2000 μm·MHz$^{-1}$.

According to variants of the invention, the piezoelectric material is lithium tantalate LiTaO$_3$, the product of Nc·W/fa possibly being between 100 and 1000 μm·MHz$^{-1}$.

According to variants of the invention, the piezoelectric material is lithium niobate, the product of Nc·W/fa possibly being between 1400 and 3000 μm·MHz$^{-1}$.

The ranges of Nc·W/fa values given above are particularly advantageous for applications in frequency bands for interrogating circuits comprising resonators, of the order of 400 MHz to 450 MHz, in particular allowing said transducer to be matched to a load impedance of between 50 and 100 ohms at 434 MHz.

According to variants of the invention, the electrodes are based on platinum.

According to variants of the invention, the electrodes are based on platinum or on titanium or on lanthanum, or a mixture of some of the aforementioned metals. For high-temperature applications (above 300° C.) the titanium (5 to 30 nm)/platinum (100 to 250 nm) pair, or tantalum/platinum pair in the same proportions, constitutes a tried-and-tested solution. Other materials may, however, be considered: zirconium, molybdenum, tungsten, etc.

For conventional temperatures (below 300° C.), it is advantageous to use aluminum, aluminum alloyed with copper, titanium or silicon, nickel, chromium, etc.

According to variants of the invention, the resonator comprises a passivation layer that may be a layer of alumina or of silicon nitride or of silicon oxide or of aluminum nitride.

Another subject of the invention is a circuit comprising at least one load impedance and at least one resonator according to the invention and having an electrical response manifesting as a peak in the coefficient of reflection $S_{11}$ at a frequency characterized by a minimum value of the parameter $S_{11}$ that is at least lower than −10 dB by at least 10 dB, the antiresonance peak of said resonator being matched to the impedance of said load.

Another subject of the invention is a remotely interrogable passive sensor comprising a circuit according to the invention; it may, for example, be a remotely interrogable passive temperature sensor according to the invention.

Another subject of the invention is a circuit comprising at least two resonators according to the invention, connected in series. The two resonators may be connected to an antenna.

Another subject of the invention is a system for interrogating a circuit or a sensor according to the invention, characterized in that it comprises interrogation means operating in a band of frequencies possibly being located between 400 MHz and 450 MHz, or in a band of frequencies possibly being located between 900 MHz and 950 MHz (ISM band at 915 MHz), or in a band of frequencies possibly being located between 850 MHz and 900 MHz (band operating at 868 MHz).

BRIEF DESCRIPTION OF THE DRAWINGS

The invention will be better understood and other advantages will become apparent on reading the following description, which is given by way of non-limiting example, and from the appended figures in which:

FIGS. 4a to 4c illustrate the analysis of the response of resonators connected in series and in parallel for a design that is optimized at resonance—$C_0$=0.73 pF: FIG. 4a relates to impedance (modulus), maximized for the resonators connected in series; FIG. 4b relates to a zoom-in on the match at 50Ω, the resonators connected in series having an impedance that is always higher than 50Ω; FIG. 4c relates to the response in terms of modulus of the coefficient of reflection $S_{11}$;

FIGS. 5a and 5b illustrate the analysis of the response of resonators connected in series and in parallel for a design that is optimized at antiresonance—$C_0$=73 pF: FIG. 5a relates to impedance (modulus), minimized by the resonators connected in parallel; FIG. 5b relates to the response in terms of modulus of the coefficient of reflection $S_{11}$;

FIGS. 6a and 6b characterize electromechanical coupling coefficients of each contribution for the two connection configurations: FIG. 6a relates to resonators in parallel: resonance operation;

DETAILED DESCRIPTION

The Applicant describes the line of reasoning that lead him to the conditions for designing and adapting surface elastic wave resonators according to the present invention in more detail below.

Figure 3A:
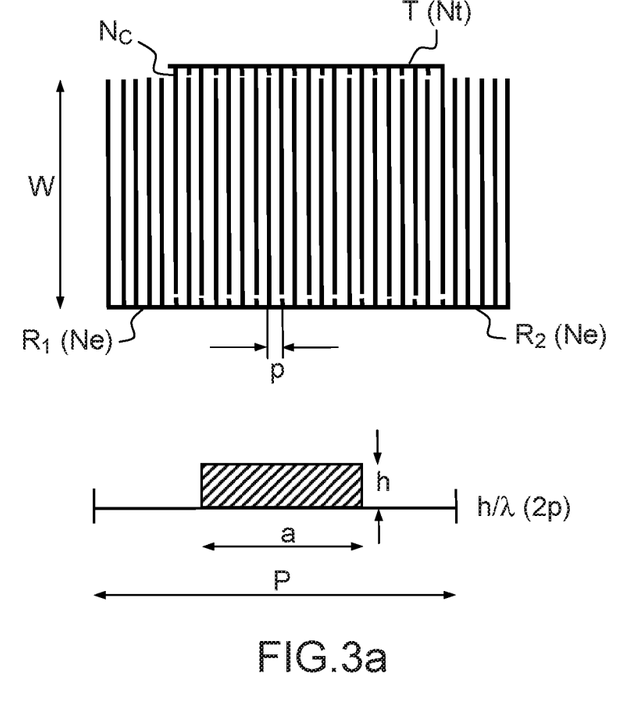
FIG. 3a illustrates a one-port elastic wave resonator used in the present invention and FIG. 3b illustrates the equivalent circuit of a one-port elastic wave resonator.

The one-port resonator of the invention may comprise, in a conventional manner, two combs with interdigitated metalizations having fingers of width a, of period p (defining a ratio referred to as the a/p metalization ratio which is equal to the width of the electrode over the repetition pitch of the electrodes) forming a surface elastic wave transducer T that is placed between two metalized reflective gratings R1 and R2. The combs are connected so as to have different polarities. The aperture W is defined by the length of overlap between two fingers of different polarity. The number of electrodes of the transducer that are connected to a hot spot is equal to Nc. FIG. 3a thus illustrates a one-port resonator with an aperture W typically potentially of about 40λ, showing the transducer T between two mirrors R1 and R2 having Ne electrodes, the transducer having a total number N+ of electrodes, the relative thickness of the electrodes being equal to h/λ=2p.

In the case of a remotely interrogable passive sensor, the transducer is connected to an antenna. Thus, the resonator/antenna assembly has in particular been studied in the context of the present invention, at the level of the impedances of the antenna and of that of the resonator.

Figure 3B:
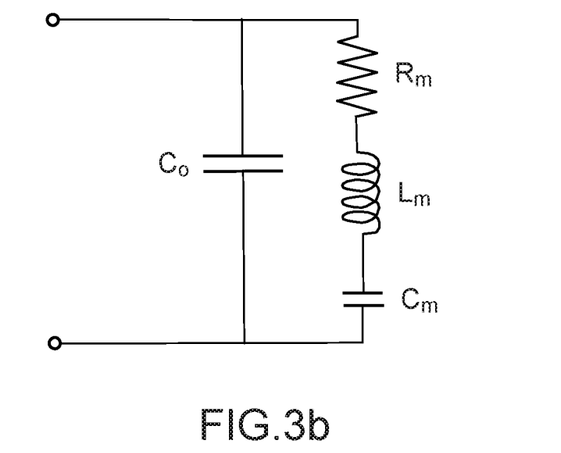

It will be recalled that one-port elastic wave resonators may be likened to an equivalent circuit having a branch, referred to as a motional branch, including, in series, an inductor $L_m$, a capacitor $C_m$ and a resistor $R_m$, all of which are referred to as being motional, and a capacitor, referred to as a static capacitor $C_0$, in parallel to this branch, as shown in FIG. 3b. This equivalent circuit is known to those skilled in the art by the name "Butterworth-VanDyke" circuit.

The circuit may be accompanied by a resistor upstream of these two branches, referred to as the series or contact resistor, representing ohmic losses due to the connection of the resonator and a leakage resistor in parallel with the static capacitor, representing current leakages in the material if the latter is not perfectly dielectric (which may be the case in the event of ionic inclusions within the crystal lattice). Such an equivalent circuit is in particular described and used in patent application VECTRON-SENGENUITY E2287584A1-WO2011/020888A1 which relates to design criteria based on the values of equivalent motional components.

The Applicant describes the line of reasoning that lead him to the conditions for designing and adapting surface elastic wave resonators according to the present invention in more detail below.

The analysis that has been carried out and which is presented in the present patent application consists of calculating the admittance of the circuit formed by the response of a one-port surface wave resonator (SWR) and of evaluating the value of the impedance at antiresonance in order to derive generic design laws therefrom.

By assuming that the resistance of the resistor $R_m$ is zero in a rough dimensioning step, it is shown that resonance and antiresonance angular frequencies are given by the following relationships:

$$\omega_r = (1/L_m C_m)^{1/2} \text{ and } \omega_a = [(C_0 + C_m)/L_m C_m C_0]^{1/2} \quad (1)$$

If it is possible to determine the capacitance of the static capacitor $C_0$, it is then possible to obtain the capacitance and inductance of $C_m$ and of $L_m$ using the following relationships:

$$C_m = C_0 \left( \frac{\omega_a^2 - \omega_r^2}{\omega_r^2} \right) \approx C_0 k_s^2 \quad (2)$$

where $k_s^2$ is the electromechanical coupling coefficient given by the relative difference between the resonance and antiresonance frequencies, namely 2(fa−fr)/fr to a first approximation, as described in the article by Royer, E. Dieulesaint, "Ondes acoustiques dans les solides" ("Acoustic Waves in Solids"), volume 1, 1998, Masson Ed.

The expression for the admittance of the equivalent circuit is such that:

$$Y(\omega) = jC_0 \omega + \frac{jC_m \omega}{(1 - L_m C_m \omega^2) + jR_m C_m \omega} \quad (3)$$

The resistance $R_m$ is given by the inverse of the real part of the admittance at the resonance:

$$Y(\omega r) = 1/Rm + j C0 \omega r$$

The damping coefficient A is given by the ratio: Rm/2Lm, which allows the quality coefficient Q of the resonator to be estimated as:

Q=ω/2A or else Q=$\omega_r L_m/R_m$, which allows the resistance of the resistor to be estimated from the quality coefficient of the resonator, and thus, broadly speaking, any electrical one-port resonator to be characterized (the coupling coefficient is easily measured if the resonance is spectrally well defined by the difference between resonance and antiresonance frequencies, a low-frequency measurement providing the static capacitor capacitance). It will be noted that the coefficient Q corresponds to the quality coefficient of the resonance according to the previously established definition. It is used below in order to simplify the text but its definition remains in accordance with that given above.

By rewriting the admittance on the basis of equation (3), (4) is obtained:

$$Y(\omega) = \frac{jC_0(1 - L_m C_m \omega^2) + jC_m \omega - R_m C_m C_0 \omega^2}{(1 - L_m C_m \omega^2) + jR_m C_m \omega} \quad (4)$$

Seeking to rationalize, as far as possible, by using relationships (1), the following is obtained:

$$Y(\omega) = C_0 \frac{j\omega L_m (\omega_a^2 - \omega^2) - R_m \omega^2}{L_m (\omega_r^2 - \omega^2) + jR_m \omega} \quad (5)$$

The admittance may again be expressed by the following equation:

$$Y(\omega) = C_0 \frac{j\omega Q(\omega_a^2 - \omega^2) - \omega^2 \omega_r}{Q(\omega_r^2 - \omega^2) + j\omega \omega_r} \quad (6)$$

in which all of the elements of the motional branch have disappeared in favor of the three objectively measurable parameters, namely the resonance and antiresonance angular frequencies and the quality coefficient at resonance, which are specific to the acoustic contribution and the static capacitor.

The impedance is expressed on the basis of equation (6), and the following equation (7) is obtained:

$$Z(\omega) = \left(\frac{1}{jC_0 \omega}\right) \frac{Q(\omega_r^2 - \omega^2) + j\omega \omega_r}{Q(\omega_a^2 - \omega^2) + j\omega \omega_r} \quad (7)$$

Once this expression has been established, it is possible to express the impedance at resonance and at antiresonance:

$$Z(\omega_r) = \left(\frac{1}{C_0 \omega_r}\right) \frac{1}{Q \frac{\omega_a^2 - \omega_r^2}{\omega_r^2} + j} \rightarrow Z(\omega_r) = \quad (8)$$

$$\left(\frac{1}{C_0 \omega_r}\right) \frac{1}{Qk_s^2 + j} \rightarrow Y(\omega_r) = (Qk_s^2 + j)C_0 \omega_r$$

$$Z(\omega_a) = -\frac{1}{C_0 \omega_a}\left(Q\frac{(\omega_r^2 - \omega_a^2)}{\omega_a \omega_r} + j\right) \rightarrow Z(\omega_a) = \quad (9)$$

$$\left(\frac{1}{C_0 \omega_r}\right)\left(Q\frac{\omega_a^2 - \omega_r^2}{\omega_a^2} + j\right) \rightarrow Z(\omega_a) \cong \frac{Qk_s^2 + j}{C_0 \omega_r}$$

In both cases, the Applicant sought to estimate the capacitance of $C_0$ for a modulus of the impedance equal to 50Ω (or of the admittance equal to 20 mS) in order to determine the structure of the transducer.

In the case of the resonance and the antiresonance, respectively, this yields:

$$|Y(\omega_r)| = C_0 \omega_r \sqrt{(Q^2 k_s^2 + 1)} \text{ and } |Z(\omega_a)| \cong \frac{\sqrt{Qk_s^4 + 1}}{C_0 \omega_r} \quad (10)$$

In both cases, it will be noted that if $Q \cdot k_s^2$ is much higher than 1, expressions (10) may be simplified as follows:

$$|Y(\omega_r)| = C_0 \omega_r Qk_s^2 = \frac{1}{R_m} \rightarrow |Z(\omega_r)| = R_m \text{ and } |Z(\omega_a)| \cong \frac{Qk_s^2}{C_0 \omega_r} \quad (11)$$

The following equation is also defined (MORGAN, David. Surface acoustic wave filters: With applications to electronic communications and signal processing. Academic Press, 2010.):

$$Y_{11}(\omega) = Y_T(\omega) G_a(\omega) + j(B_a(\omega) + \omega C_0) \quad (12)$$

where $G_a$ is the acoustic conductance, $B_a$ is the susceptance and $C_T$ is the capacitance of the transducer.

The imaginary part of the admittance is naturally combined with the contribution of the capacitance of the transducer, which is defined by a dominant electrical contribution.

These values are given by the equations:

$$G_a(\omega) \approx G_a(\omega_0) \left| \frac{\sin(X)}{X} \right|^2 \quad (13)$$

$$B_a(\omega) \approx G_a(\omega_0) \frac{\sin(2X) - 2x}{2X^2} \quad (14)$$

$$C_0 = N_c W \varepsilon_\infty \quad (15)$$

where $G_a(\omega_0) = 2.87 \omega_0 \varepsilon_\infty \; W \; N_c^2 \Delta v/v$ and $\varepsilon_\infty = \sqrt{\varepsilon_{11}\varepsilon_{33} - \varepsilon_{13}^2}$ (for quartz, $\varepsilon_\infty = \sim 5.5 \; \varepsilon$).

The Applicant firstly considered the following form, because of its simplicity and its accuracy with respect to the complete form for a synchronous transducer operating under the Bragg condition:

$$C_0 = N_c W \varepsilon_\infty \text{ with } \varepsilon_\infty = \varepsilon_0 + \sqrt{\varepsilon_{11}\varepsilon_{33} - \varepsilon_{13}^2} \quad (16)$$

and the following cases for the values of $\varepsilon_\infty$, of Q and of $k_s^2$, as given in the following table:

TABLE 1

Variation of static capacitances as a function of various usable materials, for hypothetical coupling and quality coefficients at 434 MHz

| Material | Q at 434 MHz | $k_s^2$ (%) | $\varepsilon_\infty$ (pf/m) | $C_0$res (pF) | $C_0$antires (pF) |
|---|---|---|---|---|---|
| Quartz (AT cut) | 10000 | 0.1 | $5.5\varepsilon_0$ = 48.6 | 0.734 | 73.4 |
| AlN (C-axis orientation) | 3000 | 0.25 | $10.6\varepsilon_0$ = 93.7 | 0.978 | 55 |
| ZnO (C-axis orientation) | 2500 | 0.3 | $10.2\varepsilon_0$ = 90.2 | 0.978 | 55 |
| LGS (YX cut) | 1000 | 0.35 | $32.5\varepsilon_0$ = 287 | 2.09 | 25.7 |
| LiTaO$_3$ (YXwt cut)/-90°/112° | 1000 | 1 | $42.7\varepsilon_0$ = 377.5 | 0.734 | 73.4 |
| LiNbO$_3$(YZ cut) | 1000 | 5 | $35.6\varepsilon_0$ = 315 | 0.147 | 367 |

Previously, the Applicant considered that the quality coefficient mainly depended on the type of metalization and on the nature of the substrate. In fact, working at resonance or at antiresonance affects the actual quality coefficient of the device. Experimentally, Q values that are substantially higher at antiresonance than at resonance are obtained (the coefficient Q at antiresonance is then defined as the maximum resistance divided by the full width at half maximum of the antiresonance peak when considering a reference line at 0 ohms). It will nonetheless be recalled that the coefficient Q used in the relationships is given by the relationship $Q=\omega_r L_m/R_m$, namely the quality coefficient Q defined at resonance.

In particular, components operating at resonance point (i.e. matched to 50Ω at resonance) and the coefficient $\varepsilon_\infty$ of which is higher than a value of about 15 prove to be substantially more sensitive to the series resistance than components the same coefficient of which is less than or equal to this value.

Additionally, Table 1 shows that as the coupling coefficient gets higher, the static capacitance at resonance gets smaller (much smaller than one pF).

It may thus easily be understood that a device operating at resonance is much more sensitive to parasitic capacitive elements than a resonator making use of the antiresonance.

For this reason, the Applicant proposes to favor the antiresonance over the resonance in order to minimize the sensitivity to the series resistor and the impact of parasitic capacitances on the device operating at resonance.

Table 2 below recapitulates examplary static capacitance and $N_cW$ product values at resonance and antiresonance allowing devices that are much less sensitive to the effects of parasitic capacitances at antiresonance to be designed with piezoelectric materials of high relative permittivity.

TABLE 2

Typical products of $N_CW$ at resonance and at the antiresonance for various materials, for hypothetical coupling and quality coefficients at 434 MHz

| Material | $\varepsilon_\infty$ (pf/m) | $C_0$res (pF) | $C_0$antires (pF) | NcWres (mm) | NcW antires (m) |
|---|---|---|---|---|---|
| Quartz (AT cut) | $5.5\varepsilon_0$ = 48.6 | 0.734 | 73.4 | 15.1 | 1.51 |
| AlN (C-axis orientation) | $10.6$ = $\varepsilon_0$ 93.7 | 0.978 | 55 | 10.4 | reson |
| ZnO (C-axis orientation) | $10.2\varepsilon_0$90.2 | 0.978 | 55 | 10.8 | 0.609 |
| LGS (YX cut) | $32.5\varepsilon_0$ = 287 | 2.09 | 25.7 | 7.3 | 0.089 |
| LiTaO$_3$ (YXwt cut)/-90°/112° | $42.7\varepsilon_0$ = 377.5 | 0.734 | 73.4 | 1.94 | 0.194 |
| LiNbO$_3$ (YZ cut) | $35.6\varepsilon_0$ = 315 | 0.147 | 367 | 0.467 | 1.16 |

The correctness of these calculations may be demonstrated by experiment: a resonator on langasite with a crystal orientation of (YX/t)/48.5°/26.7°, defined according to the IEEE standard on piezoelectricity Std-176, was produced in order to have an impedance of 90 ohms at antiresonance at 455 MHz.

The acoustic aperture was fixed at 700 μm and the number of fingers at the hot spot at 350. 233 pf·m$^{-1}$ is found for $\varepsilon_\infty$, namely a $C_0$ of 57.1 pF according to formula (15). The exact calculation for this configuration gives a $C_0$ of 54.2 pF. With a Q of 900 at resonance, parameters in accordance with the predictions, and which demonstrate the efficacy of the optimization process, are obtained.

The Applicant also compared design results from resonators operating at resonance and at antiresonance at neighboring frequencies, 433 MHz in this instance, always targeting a load impedance of 50 ohms and using the (YX/t)/48.5°/26.7° cut. In the case of resonance operation, the Applicant determined the number of electrodes of the transducer at the hot spot to be 25 for an aperture of 160 μm ($N_cW$=4 mm) and a metalization of 155 nm of platinum. For antiresonance operation, this same thickness of metalization is retained but the acoustic aperture increases to 900 μm and the number of fingers at the hot spot in the transducer increases to 350 ($N_cW$=315 mm). The response of the resonator is calculated using the mixed matrix method. Among other initial parameters of calculation, a relative permittivity for this configuration that is equal to 28.93 was used, namely an $\varepsilon_{\infty 0}$ value of about 265 pF/m, with a velocity of the order of 2600 m·s⁻¹ (taking into account the grounding effect of the metalization).

For the resonance-optimized resonator, the difference between resonance and antiresonance frequencies indicates an electromechanical coupling coefficient of 1.4‰ according to formula (2) and a static capacitance of 0.916 pF. For the antiresonance-optimized resonator, these characteristics go to more than 4.1‰ et 50.3 pF, respectively.

In conclusion, the Applicant has shown that in order to guarantee the spectral purity of a single resonator, the impedance at resonance or the antiresonance must be as close as possible to that of the load circuit, in this instance of the antenna, for a remotely interrogable sensor application.

For a first design pass, the Applicant considered a load impedance of 50Ω but the experiment shows that the design must be tailored to the particular case of the application. Simulating the variation in the impedance of the load circuit as a function of the temperature in the surrounding medium would be the best conceivable design approach, however an archetypical design for open space or confined metallic or non-metallic environments appears to be a robust approach to providing "universal" sensors.

In particular, the tendency of the impedances of the dipole antenna and of the resonator, respectively being between 75 and 100Ω for the first and close to 50Ω for the second at room temperature, to trend toward an identical value at working temperature (for example 600° C.) explains why the energy consumption of wireless interrogation improves with temperature.

By way of comparison, the relative dielectric permittivity of the Rayleigh waves on LGS varies between 20 and 30 versus 5 to 6 for quartz, thereby considerably increasing the impedance at resonance for a given configuration. This factor 5 is transferred to the size of the transducers when a transducer operating at resonance is optimized. The reduction in the size of the transducer to several tens of wavelengths, and an aperture that is smaller than about twenty wavelengths, when working with the resonance condition and with Rayleigh waves on LGS, leads to an increased sensitivity to parasitic capacitive elements, particularly as the coupling coefficient does not exceed 0.1% in this type of configuration. The optimization of such a resonator (operation in resonance) therefore requires the elimination of all sources of parasitic capacitance for the "resonance" mode. This mode requires a smaller number of electrodes and a smaller acoustic aperture than solutions on quartz, which actually limit the electromechanical coupling coefficient to less than 0.1 percent.

Although the footprint of the corresponding chip is optimal (30 to 40% gain in size with respect to the same sensor on quartz), functional defects remain.

Regarding the use of a resonator in "antiresonance" mode as proposed in the present patent application, it requires the use of transducers with a number of electrodes and aperture that are maximized with respect to the solutions on quartz. The "improved compactness" aspect, provided by the phase velocity of the surface waves on this material (10 to 20% lower than those on quartz), is therefore lost, but electromechanical coupling coefficients in line with the capacitances of the material (70 to 80% of the achievable potential, versus less than 40% for the "resonance" solution) are kept in return. Consequently, the static capacitance is higher than for the "resonance" solution and turns out actually to be substantially less sensitive to parasitic interference than the latter.

Additionally, the Applicant has observed that metalizations made of Ti or of Ta/Pt are particularly well suited to the production of these resonators, easily allowing quality coefficients to be obtained that are higher for the antiresonance than for the resonance. In practice, at 434 MHz and surrounding frequencies, a minimum thickness of 100 nm of Pt may be considered in order to optimize the operation of the transducer and of the mirrors, with 150 nm being a typical value.

In the case of high-temperature applications, the improvement in quality coefficient provided by the "antiresonance" approach may reach a factor of 2 to 3. This improvement is a highly advantageous feature of the sensors proposed by the Applicant, given the reduction in this figure of merit with temperature, potentially by a coefficient of 2 to 3 for an excursion of 600° C. for example (from room temperature to 650° C.). Langasite LGS is additionally known for its loss of conductivity, especially with increasing temperature. It is therefore necessary to avoid introducing sources of malfunction linked to a design fault in a sensor based on this material and its variants (LGT, LGN) and to guarantee, as far as possible, the impedance match over the entire range of variations in temperature.

The Applicant has studied the impact of connecting resonators on the resulting electrical response.

For resonators that are combined in order to produce a remotely interrogable differential sensor, the general convention is that these are connected in parallel. It is not physically impossible to connect these dipoles in another manner (in series, in a bridge, etc.) but those skilled in the art consider, as far as is currently known and practiced, that the connection of two resonators in series for the target application does not produce the desired response and cannot practically be employed.

The Applicant has demonstrated that it is possible to overcome this bias by virtue of the optimization of resonators operating in antiresonance.

Specifically, by postulating two resonators $R^{(1)}$ and $R^{(2)}$ that are optimized for resonance operation, it is shown that their admittance amounts to the sum of the respective admittances of each resonator. By considering the normalized form of the latter, the following is obtained:

$$Y(\omega) = C_0^{(1)} \frac{j\omega Q^{(1)}(\omega_a^{(1)2} - \omega^2) - \omega^2 \omega_r^{(1)}}{Q^{(1)}(\omega_r^{(1)2} - \omega^2) + j\omega \omega_r^{(1)}} + C_0^{(2)} \frac{j\omega Q^{(2)}(\omega_a^{(2)2} - \omega^2) - \omega^2 \omega_r^{(2)}}{Q^{(2)}(\omega_r^{(2)2} - \omega^2) + j\omega \omega_r^{(2)}} \quad (17)$$

It is assumed that the static capacitances and quality coefficients of the two resonators are identical in order to simplify the equations. It then becomes:

$$Y(\omega) = jC_0\omega \left( \frac{(\omega_a^{(1)2} - \omega^2) + j\omega\Delta\omega_r^{(1)}}{(\omega_r^{(1)2} - \omega^2) + j\omega\Delta\omega_r^{(1)}} + \frac{(\omega_a^{(2)2} - \omega^2) + j\omega\Delta\omega_r^{(2)}}{(\omega_r^{(2)2} - \omega^2) + j\omega\Delta\omega_r^{(2)}} \right) \quad (18)$$

where $Q = \omega_r/\Delta\omega \rightarrow w_r^2/Q = \Delta\omega\ \omega_r^2/\omega_r = \Delta\omega\ \omega_r$.

at resonance $\omega_r^{(1)}$, the equivalent circuit is written as:

$$Y(\omega_r^{(1)}) = jC_0\omega_r^{(1)} \left( \frac{(w_a^{(1)2} - \omega_r^{(1)2})}{j\omega_r^{(1)}\Delta\omega_r^{(1)}} + 1 + \frac{(w_a^{(2)2} - \omega_r^{(1)2}) + j\omega_r^{(1)}\Delta\omega_r^{(2)}}{(\omega_r^{(2)2} - \omega_r^{(1)2}) + j\omega_r^{(1)}\Delta\omega_r^{(2)}} \right) \quad (19)$$

The different resonance and antiresonance frequency terms are negligible for the resonator $R^{(2)}$, thereby allowing the following simplified form to be written:

$$Y(\omega_r^{(1)}) \simeq C_0 \frac{\omega_r^{(1)}}{\Delta\omega_r^{(1)}} \omega_r^{(1)} \frac{(\omega_a^{(1)2} - \omega_r^{(1)2})}{\omega_r^{(1)2}} + 2jC_0\omega_r^{(1)} = \qquad (20)$$
$$C_0 \omega_r^{(1)} Q k_s^2 + 2jC_0\omega_r^{(1)}$$

where $1/R_m$ is in accordance with equation (11).

The parallel connection of the two resonators makes each of them appear to have a static capacitance that is double that which is naturally associated therewith. This is well known to those skilled in the art.

By connecting the resonators in series, the Applicant proposes to solve the problem in terms of impedance in order to take advantage of the simple sum of the terms associated with each resonator.

It thus becomes:

$$Z(\omega) = \frac{1}{jC_0\omega} \left( \frac{Q(\omega_r^{(1)2} - \omega^2) + j\omega\omega_r^{(1)}}{Q(\omega_a^{(1)2} - \omega^2) + j\omega\omega_r^{(1)}} + \frac{Q(\omega_r^{(1)2} - \omega^2) + j\omega\omega_r^{(1)}}{Q(\omega_a^{(1)2} - \omega^2) + j\omega\omega_r^{(1)}} \right) \qquad (21)$$

At the antiresonance of the resonator $R^{(1)}$: the following form is obtained for the impedance by applying the same mechanisms as applied going from equations (18) to (20).

$$Z(\omega_a^{(1)}) \simeq \frac{1}{jC_0\omega_a^{(1)}} \left( \frac{Q(\omega_r^{(1)2} - \omega_a^{(1)2})}{j\omega_a^{(1)}\omega_r^{(1)}} + 2 \right) \simeq \frac{Qk_s^2}{C_0\omega_r^{(1)}} + \frac{2}{jC_0\omega_a^{(1)}} \qquad (22)$$

This result shows that the resonator $R^{(1)}$ sees a parallel capacitance divided by 2 at antiresonance.

Although achievable by those skilled in the art, the calculation of the equivalent circuit of a combination of resonators in series or in parallel being trivial, this result has never been used, considering the established opinion that it is not possible for two resonators to operate in series for the wireless interrogation thereof.

The main difference between the two cases dealt with here relates to the maximum impedance value that the resonators operating at resonance or at antiresonance may have. In the first case, the impedance of the resonator is 50Ω at resonance, but this reaches substantially higher values at antiresonance.

By taking the following numerical example with the following parameters: a quality coefficient at resonance Q of 10000 and a coupling coefficient that is equal to 0.1%, the product of $Q \cdot k_s^2$ has a value of 10.

For a resonance frequency of 434 MHz, the static capacitor at resonance has a capacitance of 0.73 pF for a set impedance of 50Ω for this frequency.

The impedance at antiresonance then reaches a value of 5 kΩ since the two conditions are separated by a factor of $Q^2 \cdot k_s^4$.

FIGS. 4a-4c and 5a-5b then show the variation in the response of two resonators whose resonance frequency is fixed at 433.5 and 434.3 MHz, respectively.

It will be noted that actually, the response in terms of coefficient of reflection $S_{11}$ is maximum for resonators that are connected in parallel with a static capacitance of 0.73 pF, while it turns out to be optimized for resonators that are connected in series with $C_0$=73 pF.

Figure 4A:
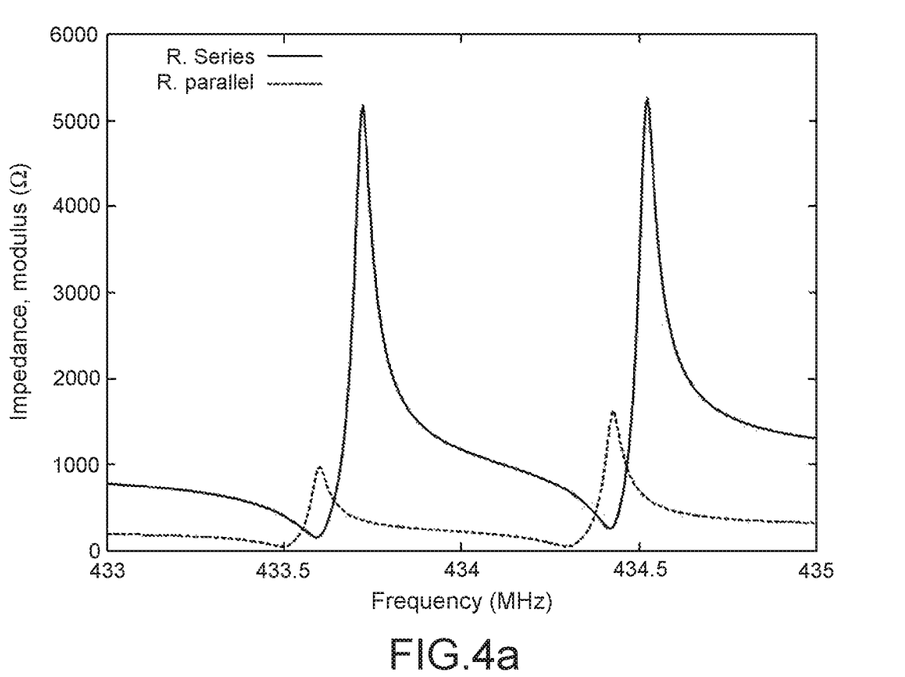
Figure 4B:
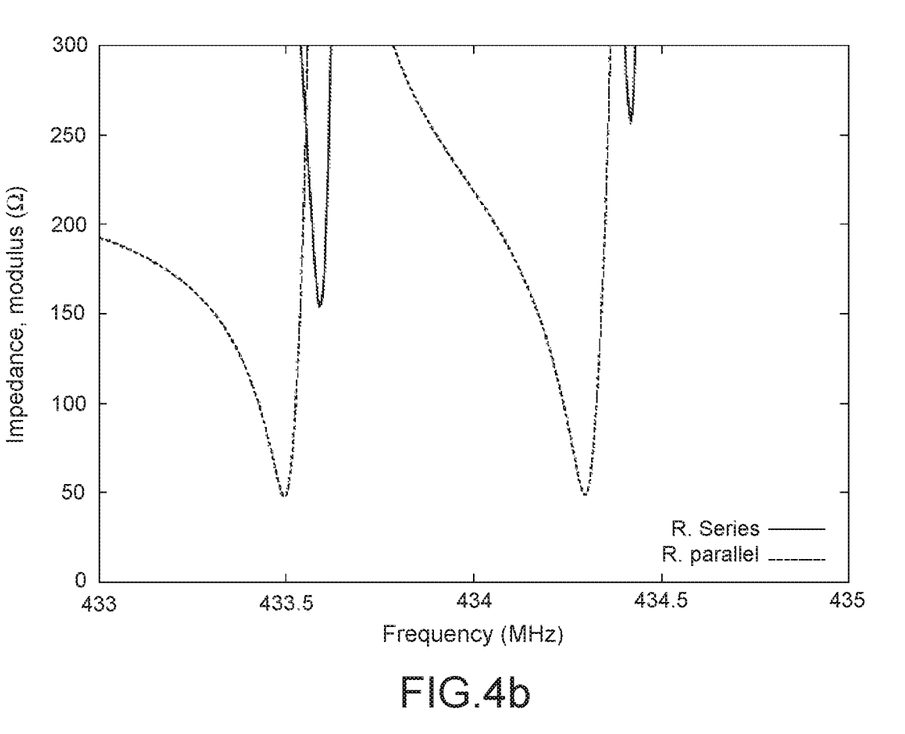
Figure 4C:
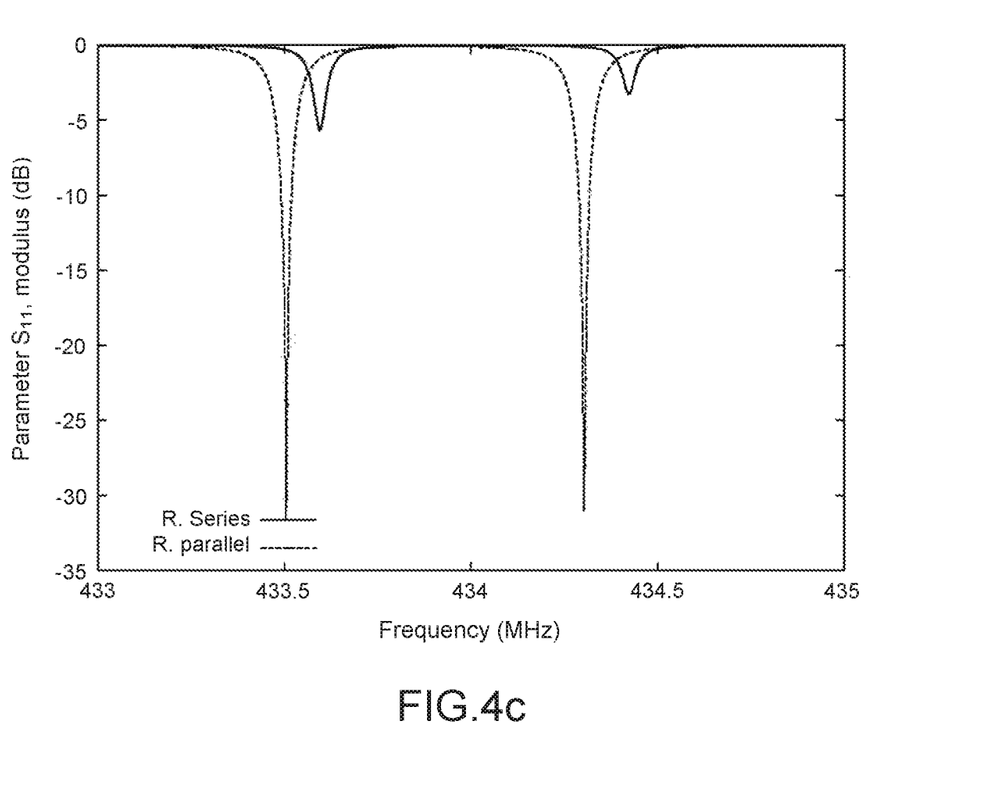

It may be seen in FIGS. 4a to 4c that both configurations indeed provide responses but the dynamic range is maximum for resonators in parallel.

Figure 5A:
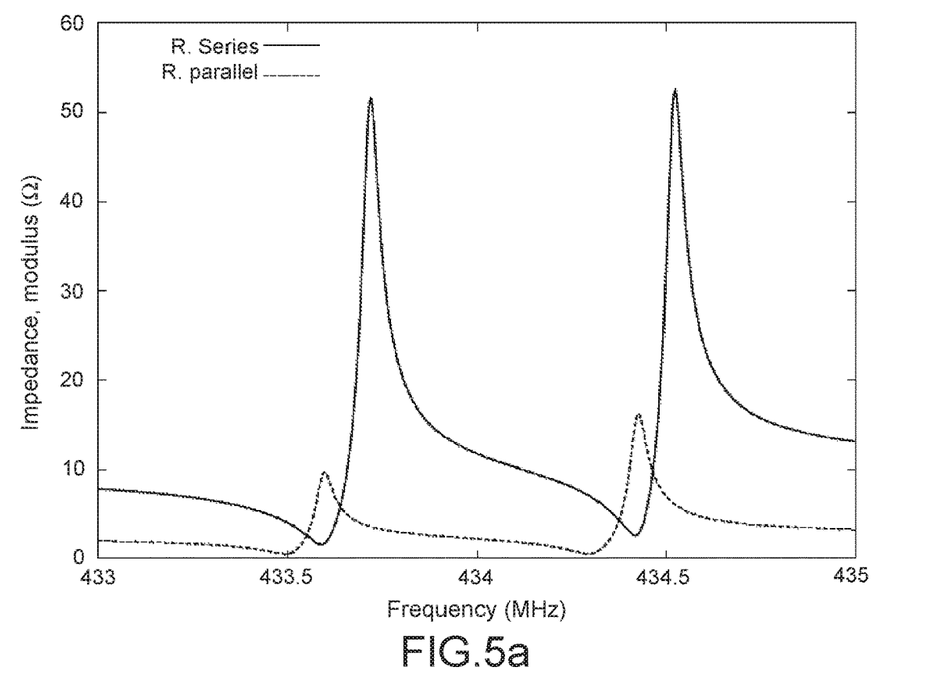
Figure 5B:
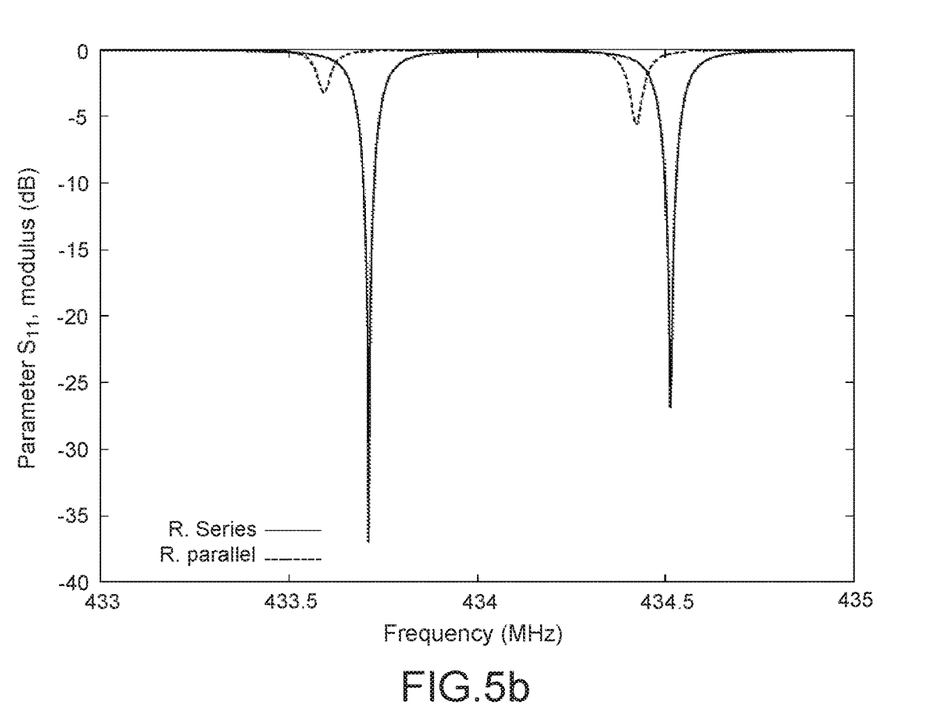

It may be seen in FIGS. 5a and 5b that both configurations indeed provide responses but the dynamic range of the resonators connected in series is substantially more marked.

Although the static capacitance seen at antiresonance by each resonator is indeed equal to $C_0/2$, the Applicant has not observed any major differences between the electromechanical coupling coefficients calculated for the two types of circuits.

It will be noted that two resonators optimized for operation at 50Ω at resonance do not have to be modified in terms of design, regardless of the mode of connection, as the set of FIGS. 4a-4c and 5a-5b shows.

Specifically, besides its resonance and antiresonance, a single-mode dipole SAW resonator behaves as a single capacitor and hence a short circuit in RF state. From the point of view of behavior in terms of reflection, neither the short circuit nor the open circuit lead to any signal absorption (all incident energy is reflected).

It is furthermore known that the presence of a resistor in series with the resonant circuit may affect the quality of resonance. Likewise, the presence of an inductor linked to the connection of the resonator adds complexity to the equivalent circuit but also provides more information on its actual response once it has been encapsulated.

A complete schematic lastly includes a possible resistor in parallel to or in series with the static capacitor, representing the leakage currents in the material (langasite in particular suffers from such a defect, this being known to those skilled in the art). It is shown that antiresonance operation allows the effect of the series-connected resistance on the quality coefficient of the antiresonance peak to be minimized.

This element means that for materials with particularly high electromechanical coupling coefficients (namely higher than one percent), it is also preferable to favor the antiresonance, the resonance notoriously being affected by the presence of a contact resistance of the order of 1Ω or more.

For an exhaustive description of the results, it is noted that in "series" mode (resonators optimized for antiresonance), the first resonator exhibits a higher coupling coefficient than the second, the sum of the coupling coefficients being substantially equal to the coupling coefficient of each resonator taken independently ($k_s^2$ is assumed to be identical for each resonator and fixed at 0.1% for a Q of 10000, $C_0$=73.2 pF, close to the case with quartz).

Figure 6A:
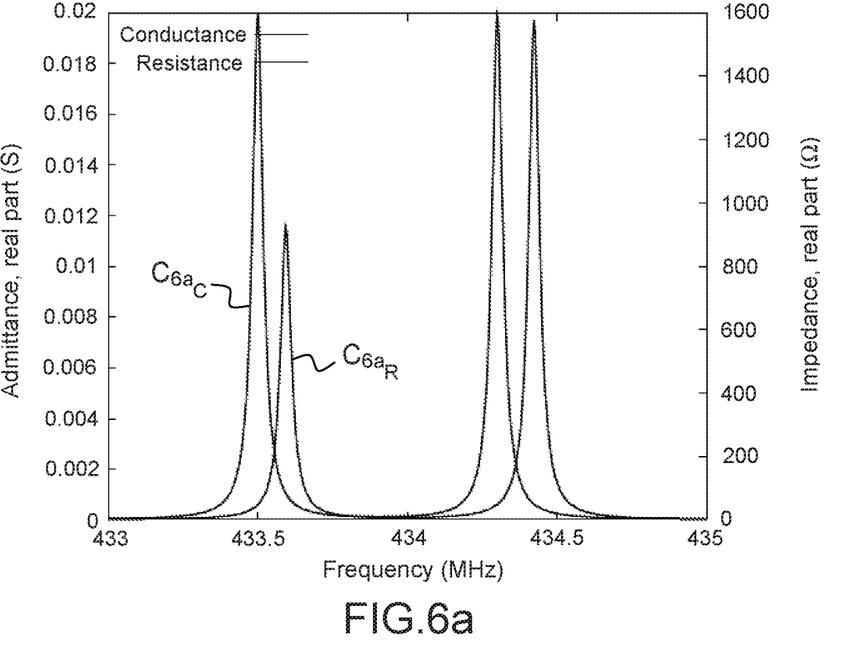
Figure 6B:
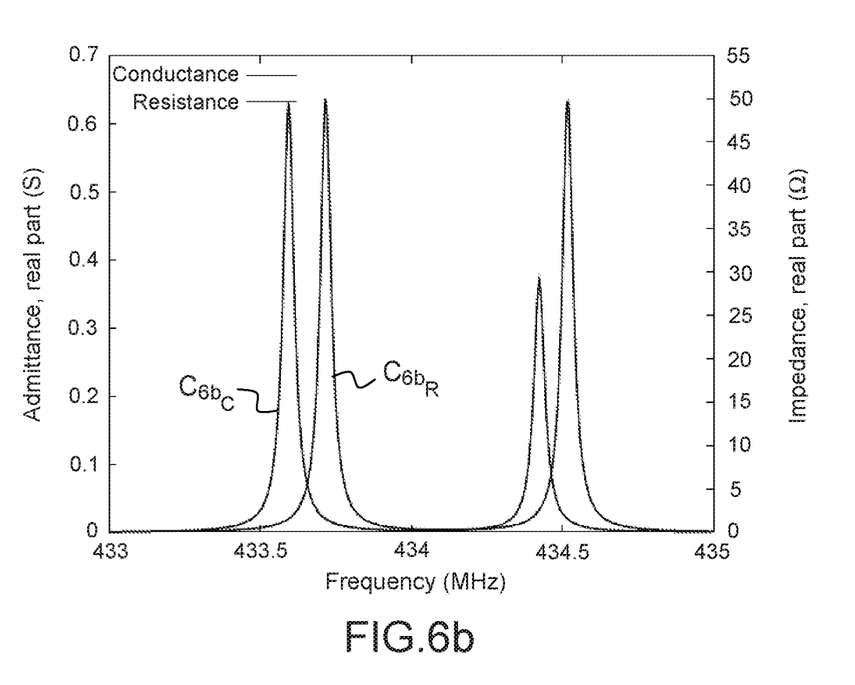

FIGS. 6a and 6b characterize electromechanical coupling coefficients of each contribution for the two connection configurations: FIG. 6a represents resonators in parallel: resonance operation; FIG. 6b represents resonators in series: antiresonance operation. The curves $C6a_R$ and $C6b_R$ represent the resistance, the curves $C6a_C$ and $C6b_C$ represent the conductance.

The Applicant found a coupling coefficient of 0.567‰ or the resonator at 433.7 MHz and 0.432‰ for that at 434.4 MHz.

The optimized situation in terms of resonance ($k_s^2$ still fixed at 0.1% for a Q of 10000, $C_0$=0.73 pF, close to the case with quartz) presents a highly inverted configuration.

Coupling coefficients of 0.433 and 0.566‰ are then found for the resonance frequencies at 433.5 and 434.3 MHz. It is therefore necessary to work upstream of the resonator assembly in order to obtain a response from the circuit that is ideally optimized and balanced at the level of the contributions of each resonator.

Figure 7A:
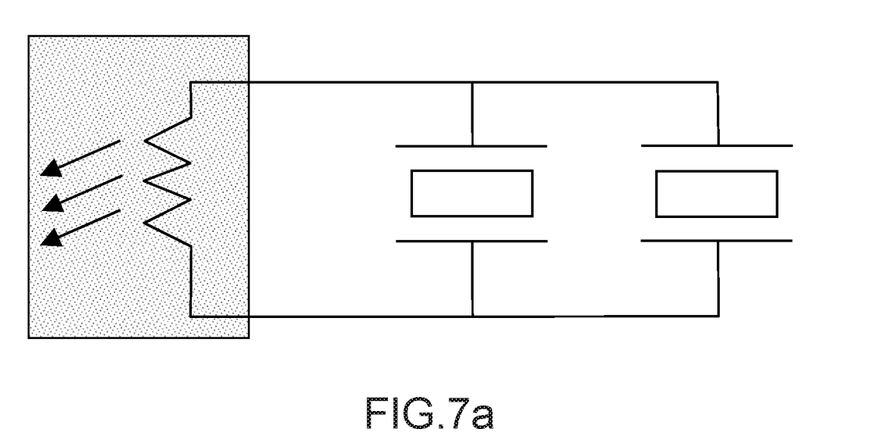
FIGS. 7a and 7b illustrate, respectively, the way in which the resonators connected in parallel may be arranged when they are operated (are interrogated) at resonance (a configuration referred to as a "conventional" configuration) and the connection for connecting the resonators in series.
Figure 7B:
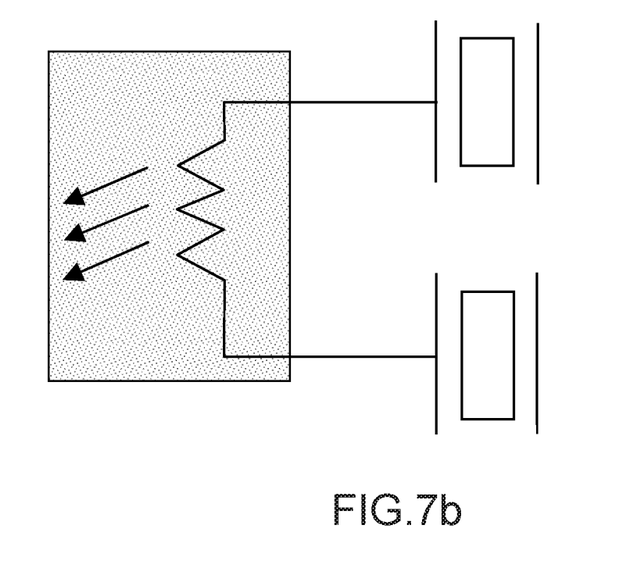

FIGS. 7a and 7b illustrate, respectively, the way in which the resonators connected in parallel may be arranged when they operate (are interrogated) in resonance (a configuration referred to as a "conventional" configuration) and the connection, discussed above, for connecting the resonators in series and which lends itself in particular to the case in which the resonators operate in antiresonance.

These figures show the antenna allowing the sensors to be interrogated. It is shown as a quadripole connected by its radiating resistor.

The invention claimed is:

1. A measurement system having a surface elastic wave resonator circuit comprising:
at least one surface elastic wave resonator;
at least one load impedance; and
the at least one surface elastic wave resonator configured as a one-port surface elastic wave resonator and comprising:
a piezoelectric material configured to propagate surface elastic waves; and
at least one transducer inserted between a pair of reflectors, said at least one transducer comprising combs of interdigitated electrodes and said at least one transducer having a number Nc of the interdigitated electrodes, the interdigitated electrodes are connected to a hot spot and the interdigitated electrodes are configured to have an acoustic aperture W,
wherein a product of Nc·W/fa for said at least one transducer being greater than 100 $\mu m \cdot MHz^{-1}$, where fa is an antiresonance frequency of said resonator;
wherein the at least one surface elastic wave resonator having an electrical response manifesting as a peak in a coefficient of reflection $S_{11}$ at a frequency characterized by a minimum value of a parameter $S_{11}$ that is at least lower than −10 dB with a phase rotation greater than 120°;
wherein the at least one surface elastic wave resonator is configured to operate in antiresonance and the at least one surface elastic wave resonator is configured such that an antiresonance peak of said resonator is matched to the at least one load impedance; and
wherein the at least one surface elastic wave resonator is configured as a remotely interrogable passive sensor.

2. The measurement system having a surface elastic wave resonator circuit according to claim 1, further comprising a radio frequency antenna connected to an input of the at least one transducer,
wherein the piezoelectric material comprises langasite, and
wherein the product of Nc·W/fa being between 100 and 1000 $\mu m \cdot MHz^{-1}$.

3. The measurement system having a surface elastic wave resonator circuit according to claim 1, further comprising a radio frequency antenna connected to an input of the at least one transducer,
wherein the piezoelectric material comprises zinc oxide, and
wherein the product of Nc·W/fa being between 400 and 2000 $\mu m \cdot MHz^{-1}$.

4. The measurement system having a surface elastic wave resonator circuit according to claim 1, further comprising a radio frequency antenna connected to an input of the at least one transducer,
wherein the piezoelectric material comprises aluminum nitride AlN, and
wherein the product of Nc·W/fa being between 400 and 2000 $\mu m \cdot MHz^{-1}$.

5. The measurement system having a surface elastic wave resonator circuit according to claim 1, further comprising a radio frequency antenna connected to an input of the at least one transducer,
wherein the piezoelectric material comprises lithium tantalate LiTaOz, and
wherein the product of Nc·W/fa being between 100 and 1000 $\mu m \cdot MHz^{-1}$.

6. The measurement system having a surface elastic wave resonator circuit according to claim 1, further comprising a radio frequency antenna connected to an input of the at least one transducer,
wherein the piezoelectric material comprises lithium niobate, and
wherein the product of Nc·W/fa being between 1400 and 3000 $\mu m \cdot MHz^{-1}$.

7. The measurement system having a surface elastic wave resonator circuit according to claim 1, further comprising a radio frequency antenna connected to an input of the at least one transducer,
wherein the interdigitated electrodes are based on platinum or on titanium or on tantalum, or a mixture of some of the aforementioned metals.

8. The measurement system having a surface elastic wave resonator circuit according to claim 1, comprising a passivation layer that comprises a layer of alumina ($Al_2O_3$) or of silicon oxide or of silicon nitride or of aluminum nitride.

9. The measurement system having a surface elastic wave resonator circuit according to claim 1 wherein a first one of the at least one surface elastic wave resonator is connected in series with a second one of the at lei one surface elastic wave resonator.

10. The measurement system having a surface elastic wave resonator circuit according to claim 9, wherein the first one of the at least one surface elastic wave resonator and the second one of the at least one surface elastic wave resonator are connected in series to an antenna.

11. The measurement system having a surface elastic wave resonator circuit according to claim 1 being configured as a remotely interrogable passive differential temperature sensor.

12. A measurement system for interrogating a surface elastic wave resonator circuit comprising:
interrogation means operating in a band of frequencies located between all of the following frequencies: 400 MHz and 450 MHz, 900 MHz and 950 MHz, and 850 MHz and 900 MHz; and
a surface elastic wave resonator circuit comprising:
at least one surface elastic wave resonator; and
at least one load impedance;
the at least one surface elastic wave resonator configured as a one-port surface elastic wave resonator and comprising:
a piezoelectric material configured to propagate surface elastic waves; and
at least one transducer inserted between a pair of reflectors, said at least one transducer comprising combs of interdigitated electrodes and said at least one transducer having a number Nc of the interdigitated electrodes, the interdigitated electrodes are connected to a hot spot and the interdigitated electrodes are configured to have an acoustic aperture W,
wherein a product of Nc·W/fa for said at least one transducer being greater than 100 $\mu m \cdot MHz^{-1}$, where fa is an antiresonance frequency of said resonator;
wherein the at least one surface elastic wave resonator having an electrical response manifesting as a peak in a coefficient of reflection $S_{11}$ at a frequency characterized by a minimum value of a parameter $S_{11}$ that is at least lower than −10 dB with a phase rotation greater than 120°;

wherein the at least one surface elastic wave resonator is configured as a remotely interrogable passive sensor; and wherein the at least one surface elastic wave resonator is configured to operate in antiresonance and the at least one surface elastic wave resonator is configured such that an antiresonance peak of said resonator is matched to the at least one load impedance.

13. The measurement system for interrogating a surface elastic wave resonator circuit according to claim 12, further comprising a radio frequency antenna connected to an input of the at least one transducer, wherein the interrogation means operates only in the band of frequencies located between 900 MHz and 950 MHz.

14. The measurement system for interrogating a surface elastic wave resonator circuit according to claim 12, further comprising a radio frequency antenna connected to an input of the at least one transducer, wherein the interrogation means operates only in the band of frequencies located between 850 MHz and 900 MHz.

15. The measurement system for interrogating a surface elastic wave resonator circuit according to claim 12, further comprising a radio frequency antenna connected to an input of the at least one transducer, wherein the interrogation means operates only in the band of frequencies located between 400 MHz and 450 MHz.

16. The measurement surface elastic wave resonator circuit according to claim 1 further comprising a radio frequency antenna connected to an input of the at least one transducer, wherein the number Nc of the interdigitated electrodes and the acoustic aperture W are configured to operate in antiresonance.

17. The measurement system for interrogating a surface elastic wave resonator circuit according to claim 12 further comprising a radio frequency antenna connected to an input of the at least one transducer, wherein the number Nc of the interdigitated electrodes and the acoustic aperture W are configured to operate in antiresonance.

18. The measurement system for interrogating a surface elastic wave resonator circuit according to claim 12, wherein:

the at least one surface elastic wave resonator is configured to be remotely interrogable via a radiofrequency wireless link, and the remotely interrogable passive sensor comprises at least one of the following: a pressure sensor or a temperature sensor.

19. The measurement system having a surface elastic wave resonator circuit according to claim 1, wherein:

the at least one surface elastic wave resonator is configured to be remotely interrogable via a radiofrequency wireless link, and the remotely interrogable passive sensor comprises at least one of the following: a pressure sensor or a temperature sensor.

* * * * *